United States Patent
Hashimoto (10) Patent No.: US 6,734,535 B1
(45) Date of Patent: May 11, 2004

(54) SEMICONDUCTOR DEVICE, METHOD OF MANUFACTURE THEREOF, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/720,860

(22) PCT Filed: May 12, 2000

(86) PCT No.: PCT/JP00/03051
§ 371 (c)(1),
(2), (4) Date: Jan. 2, 2001

(87) PCT Pub. No.: WO00/70677
PCT Pub. Date: Nov. 23, 2000

(30) Foreign Application Priority Data

May 14, 1999 (JP) ............................................. 11-133426

(51) Int. Cl.⁷ ............................................ H01L 23/495
(52) U.S. Cl. ................... 257/668; 257/778; 257/779; 257/780; 257/737; 257/738; 257/795
(58) Field of Search ..................... 257/668, 778–780, 257/737–738, 795, 680, 683, 747

(56) References Cited

U.S. PATENT DOCUMENTS 5,255,430 A * 10/1993 Tallaksen .................... 29/827
5,646,828 A * 7/1997 Degani et al. ............... 361/715
5,926,696 A * 7/1999 Baxter et al. ................ 438/118
6,140,707 A * 10/2000 Plepys et al. ................ 257/778
6,324,067 B1 * 11/2001 Nishiyama .................. 361/761

FOREIGN PATENT DOCUMENTS

| JP | A 4-287952 | 10/1992 |
| JP | U 5-1230 | 1/1993 |
| JP | A 6-295935 | 10/1994 |
| JP | A 9-36275 | 2/1997 |
| JP | A 11-97576 | 4/1999 |

* cited by examiner

Primary Examiner—David L. Talbott
Assistant Examiner—Luan Thai
(74) Attorney, Agent, or Firm—Oliff & Berridge, PLC (57) ABSTRACT

A semiconductor device comprising: a semiconductor chip (10) on which a plurality of electrodes are formed; a first flexible substrate (20) which is larger than the surface of the semiconductor chip (10) on which the electrodes (12) are formed, having a wiring pattern (22) formed thereon, and having the semiconductor chip (10) mounted thereon; a plurality of external terminals (38) electrically connected to the electrodes (12) by the wiring pattern (22); and a second flexible substrate (30) adhered to the first flexible substrate (20) avoiding the semiconductor chip (10).

15 Claims, 4 Drawing Sheets

SEMICONDUCTOR DEVICE, METHOD OF MANUFACTURE THEREOF, CIRCUIT BOARD, AND ELECTRONIC INSTRUMENT

TECHNICAL FIELD

The present invention relates to a semiconductor device and method of manufacture thereof, a circuit board and an electronic instrument.

BACKGROUND OF ART

In the well-known semiconductor device package form T-BGA (Tape Ball Grid Array), or CSP of the fan-out type or fan-in/out type, the package size is slightly larger than the chip size. In a semiconductor device of this form, a flexible substrate is used, and on the part of the flexible substrate protruding from the semiconductor chip also, solder balls are provided. Then to ensure the coplanarity of the solder balls, a stiffener is commonly adhered.

However, bearing in mind the stiffness, workability, and other factors, stainless steel is used for the stiffener, and this is not only expensive, but also requires separate procurement of the component only when necessary.

DISCLOSURE OF THE INVENTION

The present invention solves these problems, and has as its objective the provision of a semiconductor device and method of manufacture thereof, a circuit board and an electronic instrument, such that an expensive stiffener can be omitted and coplanarity can be assured by using the components used in the mounting process.

(1) The semiconductor device according to one aspect of the present invention comprises:

- a semiconductor chip on which a plurality of electrodes are formed;
- a first flexible substrate on which a wiring pattern is formed and on which the semiconductor chip is mounted;
- a plurality of external terminals electrically connected to the electrodes with the wiring pattern interposed; and
- a second flexible substrate adhered to the first flexible substrate avoiding the semiconductor chip.

According to this aspect of the present invention, since the first flexible substrate is larger than the semiconductor chip, a part projects outside the semiconductor chip, and the second flexible substrate is adhered to this part. By means of this, the first flexible substrate is strengthened, and the coplanarity of the external terminals is assured. Since the component used for strengthening is also a flexible substrate, no expensive stiffener is required.

(2) In this semiconductor device, the first and second flexible substrates may be of the same material and of substantially the same thickness.

Since a single type of component is used the cost can be reduced.

(3) In this semiconductor device, the wiring pattern may be disposed to face the second flexible substrate; a plurality of through holes may be formed in the first flexible substrate; the external terminals nay be provided to be connected with the wiring pattern via the through holes; and the external terminals may project from a surface of the first flexible substrate opposite to that on which the wiring pattern is formed.

Since the wiring pattern is positioned between the first and second flexible substrates, both sides of the wiring pattern can be covered and protected.

(4) The semiconductor device may further comprise a conductive layer which is formed between the first and second flexible substrates, of the same material and of substantially the same thickness as the wiring pattern, and is electrically insulated from the wiring pattern.

Since a pair of electrically conductive components of[ ]the same material and the same thickness is provided between the first and second flexible substrates, the construction is symmetrical in the thickness direction.

(5) In this semiconductor device, the means of adherence of the first flexible substrate and the wiring pattern, and the means of adherence of the second flexible substrate and the conductive layer may he the same.

By means of this, after consideration of the means of adherence, the construction is symmetrical in the thickness direction.

(6) In this semiconductor device, the conductive layer may be of a symmetrical form with the wiring pattern.

By means of this, the construction is symmetrical not only in the thickness direction but also in the plane.

(7) In this semiconductor device, a first insulating film may be formed on a surface of the wiring pattern opposite to the first flexible substrate; and a second insulating film may be formed on a surface of the conductive layer opposite to the second flexible substrate.

Electrical insulation of the wiring pattern and the conductive layer can be achieved by the first and second insulating films.

(8) In this semiconductor device, the electrodes of the semiconductor chip may be electrically connected to the wiring pattern by an anisotropic conductive material having electrically conductive particles dispersed in an adhesive; and the first and second flexible substrates may be adhered to each other by the anisotropic conductive material.

Since the component electrically connecting the electrodes of the semiconductor chip to the wiring pattern is the component for adhesion of the first and second flexible substrates, the number of components can be reduced, and the cost can be reduced.

(9) In this semiconductor device, the first and second flexible substrates may be adhered to each other by a resin; and the resin may be provided on a surface of the first flexible substrate on which the wiring pattern is formed, and be in close contact with a surface of the wiring pattern facing the second flexible substrate and edge surfaces of the wiring pattern.

By means of this, the resin adhering the first and second flexible substrates is in close contact with the wiring pattern. So that gaps allowing moisture to accumulate are eliminated from the surface of the wiring pattern, and the moisture resistance is improved.

(10) On a circuit board of the present invention is mounted the above mentioned semiconductor device.

(11) An electronic instrument of the present invention has the above mentioned semiconductor device.

(12) A method of manufacture of a semiconductor device according to another aspect of the present invention comprises the steps of:

providing a semiconductor chip which has a plurality of electrodes, a first flexible substrate on which a wiring pattern is formed, and a second flexible substrate;

mounting the semiconductor chip on the first flexible substrate;

adhering the second flexible substrate to a portion of the first flexible substrate avoiding a region in which the semiconductor chip is mounted; and providing external terminals electrically connected to the electrodes with the wiring pattern interposed.

According to this aspect of the present invention, since the first flexible substrate is larger than the semiconductor chip, a part projects outside the semiconductor chip, and the second flexible substrate is adhered to this part. By means of this, the first flexible substrate is strengthened, and the coplanarity of the external terminals is assured. Since the component used for strengthening is also a flexible substrate, no expensive stiffener is required.

(13) The method of manufacture of a semiconductor device may further comprise a step of punching out the first and second flexible substrates after the step in which the second flexible substrate is adhered.

By means of this, the first and second flexible substrates are punched out, and the final form of the semiconductor device can be obtained.

(14) In this method of manufacture of a semiconductor device, the first and second flexible substrates may be in tape form; the wiring pattern may be repeatedly formed on the first flexible substrate; and a hole may be formed repeatedly on the second flexible substrate to avoid the semiconductor chip.

By means of this, a plurality of semiconductor devices can be manufactured continuously.

(15) The method of manufacture of a semiconductor device may further comprise a step of punching out the first flexible substrate avoiding the second flexible substrate after the step in which the second flexible substrate is adhered.

Since only the first flexible substrate is punched out, compared with the case in which the first and second flexible substrates are punched out, the processing is simplified, and the blanking die can be made inexpensive and of long life.

(16) In this method of manufacture of a semiconductor device, the first flexible substrate may be in tape form; the second flexible substrate may be formed to be smaller than a region punched out in the first flexible substrate; the wiring pattern may be formed repeatedly on the first flexible substrate; and a hole may be formed in the second flexible substrate so as to avoid the semiconductor chip.

Since the first flexible substrate is in tape form, a plurality of semiconductor devices can be manufactured continuously.

(17) In this method of manufacture of a semiconductor device, the step of mounting the semiconductor chip may be carried out after the step of adhering the second flexible substrate.

(18) In this method of manufacture of a semiconductor m device, the step of adhering the second flexible substrate may be carried out after the step of mounting the semiconductor chip.

(19) In this method of manufacture of a semiconductor device, the step of mounting the semiconductor chip may include a step of providing an anisotropic conductive material having electrically conductive particles dispersed in an adhesive on the first flexible substrate, exceeding a region of mounting the semiconductor chip, and a step of electrically connecting the electrodes to the wiring pattern with the anisotropic conductive material interposed and the second flexible substrate may be adhered to the first flexible substrate by the anisotropic conductive material in the step of adhering the second flexible substrate.

Since the first and second flexible substrates are adhered by using the material which electrically connects the electrodes of the semiconductor chip to the wiring pattern, the number of steps of applying material for adhesion can be reduced.

(20) In this method of manufacture of a semiconductor device, the step of adhering the second flexible substrate may include: a step in which a resin is applied to at least one of the first and second flexible substrates; and a step in which the first and second flexible substrates are brought into close contact with the resin interposed to bring the resin into close contact with a surface of the wiring pattern facing the second flexible substrate and edge surfaces of the wiring pattern.

By means of this, the first and second flexible substrates are adhered by the resin, and the resin is brought into close contact with the wiring pattern. By means of this, gaps allowing moisture to accumulate are eliminated from the surface of the wiring pattern, and the moisture resistance is improved.

(21) In this method of manufacture of a semiconductor device, positioning holes may be formed in one of the first and second flexible substrates, and positioning marks may be formed in the other, and the holes and the marks may be aligned for positioning the first and second flexible substrates.

By means of this, the first and second flexible substrates can be provided in accurate positions.

(22) In this method of manufacture of a semiconductor device, the second flexible substrate may be formed of the same material and of the same thickness as the first flexible substrate.

Since a single type of component is used, the cost can be reduced.

(23) In this method of manufacture of a semiconductor device, a conductive layer of the same material and of the same thickness as the wiring pattern may be formed on the second flexible substrate; and the conductive layer and the wiring pattern may be disposed to face to each other and be made electrically insulated from each other; and the second flexible substrate may be adhered to the first flexible substrate.

By means of this, the first flexible substrate on which the wiring pattern is formed, and the second flexible substrate on which the conductive layer is formed are adhered. Since a pair of electrically conductive components of the same material and the same thickness is provided between the first and second flexible substrates, the construction is symmetrical in the thickness direction.

(24) In this method of manufacture of a semiconductor device, the conductive layer may be of a symmetrical form with the wiring pattern.

By means of this, the construction is symmetrical not only in the thickness direction but also in the plane.

(25) In this method of manufacture of a semiconductor device, a first insulating film is formed on the wiring pattern of the first flexible substrate; and a second insulating film is formed on the conductive layer of the second flexible substrate.

By means of this, electrical insulation of the wiring pattern and the conductive layer can be achieved by the first and second insulating films.

BEST MODE FOR CARRYING OUT THE INVENTION

Embodiment of the present invention will now be described with reference to the drawings. The package form of the semiconductor device of the present invention may be any of BGA (Ball Grid Array) including T-BGA (Tape Ball Grid Array), CSP (Chip Size/Scale Package) including T-CSP (Tape Chip Size/Scale Package), TCP (Tape Carrier Package) further packaged by the use of TAB bonding technology, and so forth. In the method of manufacture of the semiconductor device of the present invention, as the method of bonding the wiring pattern to the electrodes of the semiconductor chip, TAB (Tape Automated Bonding), flip-chip bonding, COF (Chip On Film) and similar face-down bonding, bonding using an anisotropic conductive material, or COB (Chip On Board) using wire bonding, or the like may be cited.

Figure 1:
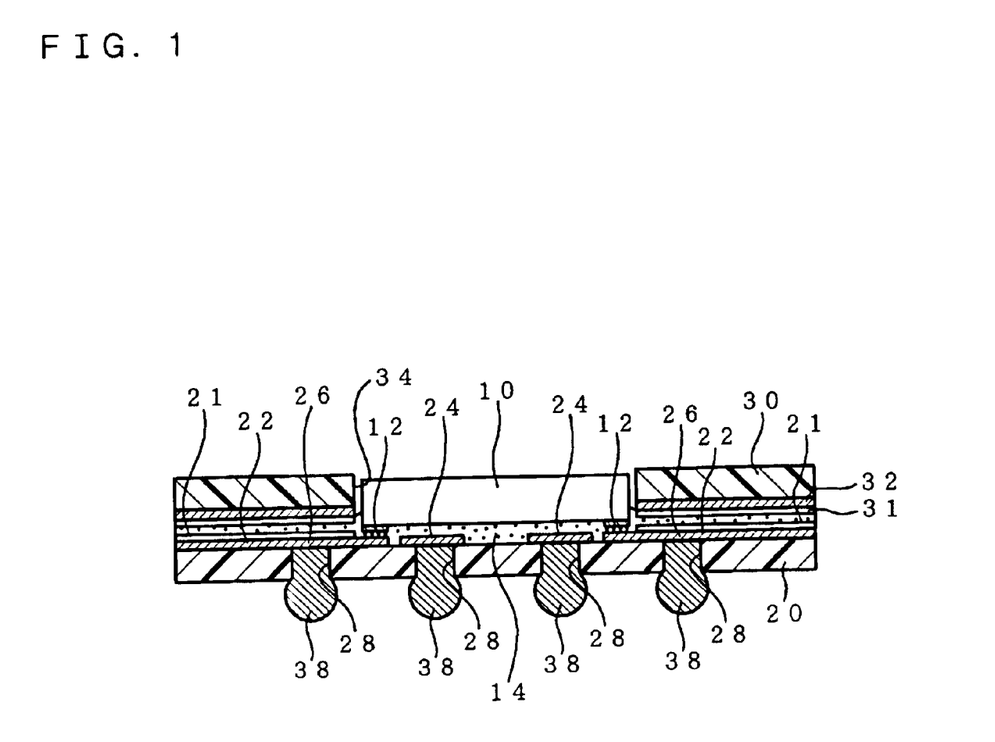
FIG. 1 shows an embodiment of a semiconductor device to which the present invention is applied.

FIG. 1 shows an embodiment of a semiconductor device to which the present invention is applied. This semiconductor device comprises a semiconductor chip 10, a first flexible substrate 20, a second flexible substrate 30, and a plurality of external terminals 38.

When the semiconductor chip 10 is rectangular (square or oblong) in plan view, a plurality of electrodes 12 is formed along at least one edge (commonly, on a pair of opposite edges or all four edges), on one surface (the active surface) of the semiconductor chip 10. Alternatively, a plurality of electrodes 12 may be aligned in a row, in the center of one surface of the semiconductor chip 10. The electrodes 12 shown in FIG. 1 comprise pads of aluminum or the like and bumps formed by solder balls, gold wire balls, gold plating, or the like. Nickel, chromium, titanium, or the like may be added between the pads and bumps, as a layer to prevent diffusion of the bump metal. Alternatively, the bumps may be eliminated, and the electrodes 12 formed of pads only.

The first flexible substrate 20 is commonly formed of an organic material, and super-engineering-plastics films, polyimide film or the like with their excellent heat resistance is appropriate. If the first flexible substrate 20 is larger than the surface of the semiconductor chip 10 on which the electrodes 12 are formed, then there are no particular restrictions on its overall form. The thickness of the first flexible substrate 20 is commonly determined by its material, and this is not particularly subject to restriction.

On the first flexible substrate 20 a wiring pattern 22 is formed. The wiring pattern 22 is formed on one surface of the first flexible substrate 20. In addition to the wiring pattern 22 on the one surface of the first flexible substrate 20, on the other surface a wiring pattern may also be formed. The wiring pattern 22 can be formed by sputtering an electrically conductive film of copper or the like covering the first flexible substrate 20, and then etching this. Alternatively, a thermoplastic resin such as a polyimide resin or the like forming the first flexible substrate 20 may be adhered to a conductive layer such as a copper layer or the like, and then the conductive layer may be etched to form the first flexible substrate 20 and wiring pattern 22. In these cases, the wiring pattern 22 is formed directly on the first flexible substrate 20, in a two-layer substrate without an intervening adhesive. Alternatively, a three-layer substrate may be used, with an adhesive interposed between the first flexible substrate 20 and the wiring pattern 22. Alternatively, a substrate of build-up multi-layer construction in which an insulating resin and wiring pattern are laminated, or a multi-layer substrate having a plurality of substrates laminated may be used.

The wiring pattern 22 connects the plurality of electrodes 12 of the semiconductor chip 10 and the plurality of external terminals 38. The wiring pattern 22 may comprise lands 24 to which the electrodes 12 are bonded, and lands 26 on which external terminals 38 are provided. On the first flexible substrate 20 a plurality of through holes 28 are formed. The lands 26 for providing external terminals 33 are positioned over the through holes 28. In the example shown in FIG. 1, the through holes 28 are formed inside and outside the region of mounting of the semiconductor chip 10, and external terminals 38 are provided in positions corresponding to the through holes 28. Therefore, the semiconductor device show in FIG. 1 is a fan-in/out type. Alternatively, the through holes 28 may be formed on the outside only of the region of mounting of the semiconductor chip 10, and external terminals 38 formed in positions corresponding to the through holes 28, to constitute a fan-out type of semiconductor device. Alternatively, the through holes 28 may be formed on the inside only of the region of mounting of the semiconductor chip 10, and external terminals 38 formed in positions corresponding to the through holes 28, to constitute a fan-in type of semiconductor device.

On the surface of the wiring pattern 22, a first insulating film 21 may be provided. In more detail, the first insulating film 21 may be provided on the wiring pattern 22 excepting the area in close contact with the first flexible substrate 20. A resin such as a solder resist can be used as the first insulating film 21. The first insulating film 21 may be formed on the surface of the first flexible substrate 20 on which the wiring pattern 22 is formed, excluding the part in which electrical connection is required on the wiring pattern 22.

A wiring board constituted by the first flexible substrate 20 and the wiring pattern 22 may be formed by punching a tape carrier as used in TAB technology, or may be formed as an FPC (Flexible Printed Circuit). In general, a tape carrier has a device hole formed, and inner leads project into the device hole, but a flexible substrate in tape form without a device hole may equally be used as the first flexible substrate 20.

The semiconductor chip 10 is mounted on the first flexible substrate 20. The electrodes 12 of the semiconductor chip 10 and the wiring pattern 22 are electrically connected. The manner of mounting may be face-up bending, or face-down bonding. For face-up bonding, the electrodes 12 of the semiconductor chip 10 and the wiring pattern 22 are connected by wire bonding or TAB bonding, and commonly thereafter the mounting part of the semiconductor chip 10 is covered by resin. For face-down bonding, electrically conductive resin paste may be used, metal bonding with Au—Au, Au—Sn, solder, or the like may be used, the contraction force of insulating resin may be used, and here any of these techniques may be used. The semiconductor device shown in FIG. 1 has the semiconductor chip 10 subjected to face-down bonding, using an anisotropic conductive material 14.

The anisotropic conductive material 14 has electrically conductive particles (electrically conductive filler) dispersed in an adhesive (binder), and may also include a dispersing agent. A thermosetting adhesive is commonly used as the adhesive of the anisotropic conductive material 14. The anisotropic conductive material 14 is provided at least on the portion of the wiring pattern 22 bonded to the semiconductor chip 10. Alternatively, the anisotropic conductive material 14 may be provided to cover the whole of a region of mounting the semiconductor chip 10 of the first flexible substrate 20. The anisotropic conductive material 14 is squeezed between the electrodes 12 and the wiring pattern 22, and is disposed to provide electrical connection therebetween, by means of the electrically conductive particles.

The external terminals 38 are provided on the first flexible substrate 20. Solder balls may equally be the external terminals 38. Alternatively, a portion of the airing pattern 22 may be bent within the through holes 28, to form the external terminals 38. In the example shown in FIG. 1, the wiring pattern 22 is formed on one surface of the first flexible substrate 20, and external terminals 38 are provided on the wiring pattern 22 passing through the through holes 28. Then the external terminals 38 project from the other surface of the first flexible substrate 20. In the example shown in FIG. 1, the external terminals 38 are provided inside and outside the region of mounting of the semiconductor chip 10, and therefore this semiconductor device is a fan-in/out type. Alternatively, the external terminals 38 may be provided on the outside only of the region of mounting of the semiconductor chip 10, to constitute a fan-out type of semiconductor device. Alternatively, the external terminals 38 may be provided on the inside only of the region of mounting of the semiconductor chip 10, to constitute a fan-in type of semiconductor device.

The second flexible substrate 30 is adhered to the first flexible substrate 20, avoiding the semiconductor chip 10. For example, if the semiconductor chip 10 is mounted in the center of the first flexible substrate 20, the second flexible substrate 30 is adhered to the periphery of the first flexible substrate 20 (the part other than the center). The second flexible substrate 30 is adhered to the surface of the first flexible substrate 20 on which the wiring pattern 22 is formed. When the semiconductor chip 10 is mounted on this surface, a hole 34 may be formed in the second flexible substrate 30 to 6, allow the semiconductor chip 10 to pass through.

The second flexible substrate 30 may have a convex portion to correspond to the semiconductor chip 10, and in this case a hole avoiding the semiconductor chip 10 is not required, and therefore the blanking die is simplified.

The second flexible substrate 30 may be formed of the same material as the first flexible substrate 20, and may be of the same thickness as the first flexible substrate 20. Alternatively, the second flexible substrate 30 may be formed of a material having a coefficient of thermal expansion substantially equal to that of the first flexible substrate 20. On the second flexible substrate 30 shown in FIG. 1, a conductive layer 32 is formed. The conductive layer 32 may be formed of the same material as the wiring pattern 22, and may be of the same thickness. The conductive layer 32 is preferably of a symmetrical form with the wiring pattern 22. The symmetrical form is commonly the same form as the wiring pattern 22. Furthermore, the means of adherence of the second flexible substrate 30 and the conductive layer 32 is preferably the same as the means of adherence of the first flexible substrate 20 and the wiring pattern 22. Preferably, for example, the same adhesive is used, or no adhesive is used and the wiring pattern 22 and conductive layer 32 are adhered to the first and second flexible substrates 20 and 30 by the close contact force. On the conductive layer 32, a second insulating film 31 is preferably formed. The second insulating film 31 may be of the co same material as the first insulating film 21, and may be of the same thickness.

The second flexible substrate 30 is adhered to the first flexible substrate 20, with the surface on which the conductive layer 32 is formed facing the wiring pattern 22. If the first and second flexible substrates 20 and 30 are of the same material and the same thickness, the wiring pattern 22 and the conductive layer 32 are of the same material and the same thickness, and the means of adherence of the first flexible substrate 20 to the wiring pattern 22 and the means of adherence of the second flexible substrate 30 to the conductive layer 32 are tile same, then the construction between the first and second flexible substrates 2) and 30 is symmetrical in the thickness direction. As a result the difference in the coefficient of thermal expansion between the first flexible substrate 20 and the wiring pattern 22, and the difference in the coefficient of thermal expansion between the second flexible substrate 30 and the conductive layer 32 are equal, and warping can be restrained. If the same wiring board (for example, TAB tape) is used as the first and second flexible substrates 20 and 30, then components can be shared, and the cost can be reduced.

In the example of FIG. 1, the first and second flexible substrates 20 and 30 are adhered by the anisotropic conductive material 14. In this case, the anisotropic conductive material 14 is provided to exceed the area in which the electrodes 12 of the semiconductor chip 10 are formed. Alternatively, the first and second flexible substrates 20 and 30 may be adhered by a resin other than the anisotropic conductive material 14, such as an adhesive. In either case, when the first and second flexible substrates 20 and 30 are adhered, both are subject to pressure, and therefore the anisotropic conductive material 14 or resin is made to be in close contact with the surface and edges of the wiring pattern 22. As a result, no gaps are formed on the surface of the wiring pattern 22, and the moisture resistance is improved. This is particularly effective when the first insulating film 21 is not formed on the wiring pattern 22

According to this embodiment, since the first flexible substrate 20 is larger than the semiconductor chip 10, a portion projects outside the semiconductor chip 10, and the second flexible substrate 30 is adhered to this portion. By means of this, the first flexible substrate 20 is strengthened, and the coplanarity of the external terminals 38 is assured. Since the component used for strengthening is also a flexible substrate, an expensive stainless steel or copper alloy stiffener is not required.

This embodiment of the semiconductor device is formed as described above, and a description of the method of manufacture of this semiconductor device now follows.

Figure 2:
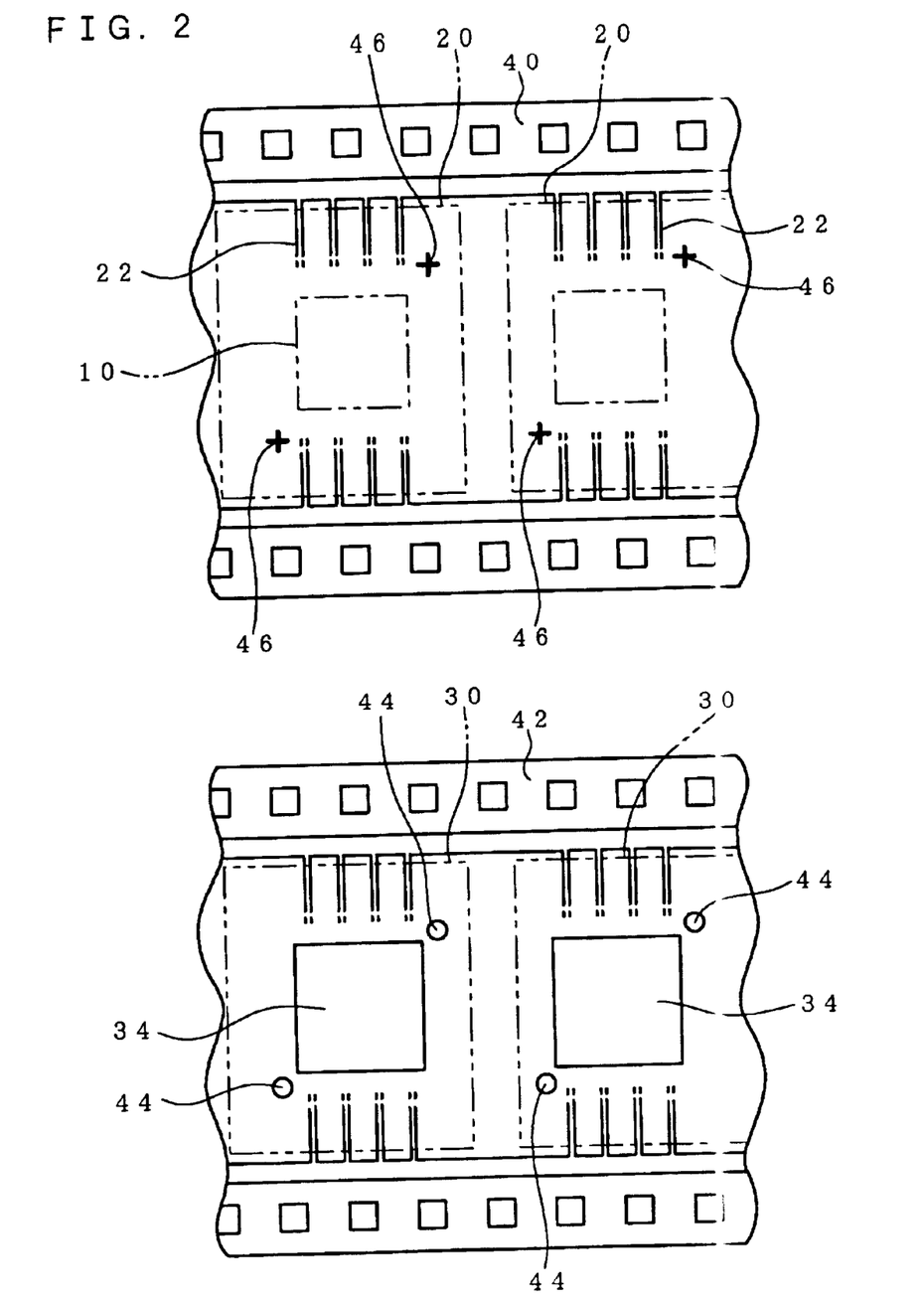
FIG. 2 shows a method of manufacture of a semiconductor device to which the present invention is applied.

First, the semiconductor chip 10 and first and second flexible substrates 40 and 42 shown in FIG. 2 are taken. The first flexible substrate 40 shown in FIG. 2 is in tape form, integrating a plurality of the first flexible substrates 20 in final form (see FIG. 1), and is formed with the wiring pattern 22 repeating. The second flexible substrate 42 shown in FIG. 2 is in tape form, integrating a plurality of the second flexible substrates 30 in final form (see FIG. 1), and has formed repeating holes 34, avoiding the semiconductor chip 10. Alternatively, projecting portions may be previously formed repeating to avoid the semiconductor chip 10. Alternatively, first and second flexible substrates 20 and 30 in their final form may be taken. Individual first and second flexible substrates larger than the first and second flexible substrates 20 and 30 in their final form may be taken. Alternatively, the first flexible substrate 40 in tape form and the second flexible substrate 30 in its final form may be taken. Alternatively, the first flexible substrate 40 in tape form and a second flexible substrate larger than the final form may be taken.

Preferably, positioning holes 44 are formed in one of the first and second flexible substrates 40 (20) and 42 (30), and positioning marks 46 are formed in the other. By aligning the holes 44 and marks 46, the positioning of the first and second flexible substrates 40 (20) and 42 (30) can be achieved.

When the first or second flexible substrate 40 or 42 in tape form, or the first or second flexible substrate lager than the final form is used, then steps for punching these out are included.

For example, after the step in which the second flexible substrate 42 in tape form or larger than the final form is adhered to the first flexible substrate 40 in tape form or larger than the final form, a step may be included to punch out the first and second flexible substrates 40 and 42.

Alternatively, after carrying out a step to adhere the second flexible substrate 30 in its final form (see FIG. 1) to the first flexible substrate 40 in tape form or larger than the final form, a step of punching out the first flexible substrate 40 to avoid the second flexible substrate 30 may be carried out.

Next, a step of mounting the semiconductor chip 10 on the first flexible substrate 40 (20), a step of adhering the second flexible substrate 42 (30) to the first flexible substrate 40 (20), and a step of providing the external terminals 38 are carried out. The order of these steps is not significant, but they may for example be carried out in sequence as follows.

First Example

After the step of mounting the semiconductor chip 10, a step of adhering the second flexible substrate 42 (30) is carried out. For example, on the first flexible substrate 40 (20), the anisotropic conductive material 14 is provided to exceed the region of mounting of the semiconductor chip 10, and the semiconductor chip 10 is mounted. Then the electrodes 12 of the semiconductor chip 10 and the wiring pattern 22 are electrically connected. Thereafter, by means of the anisotropic conductive material 14, the second flexible substrate 42 (30) is adhered to the first flexible substrate 40 (20). By means of this step, the semiconductor device shown in FIG. 1 can be manufactured. Alternatively, by means of a resin such as an adhesive or the like, the second flexible substrate 42 (30) may be adhered to the first flexible substrate 40 (20).

SECOND EXAMPLE

Figure 3:
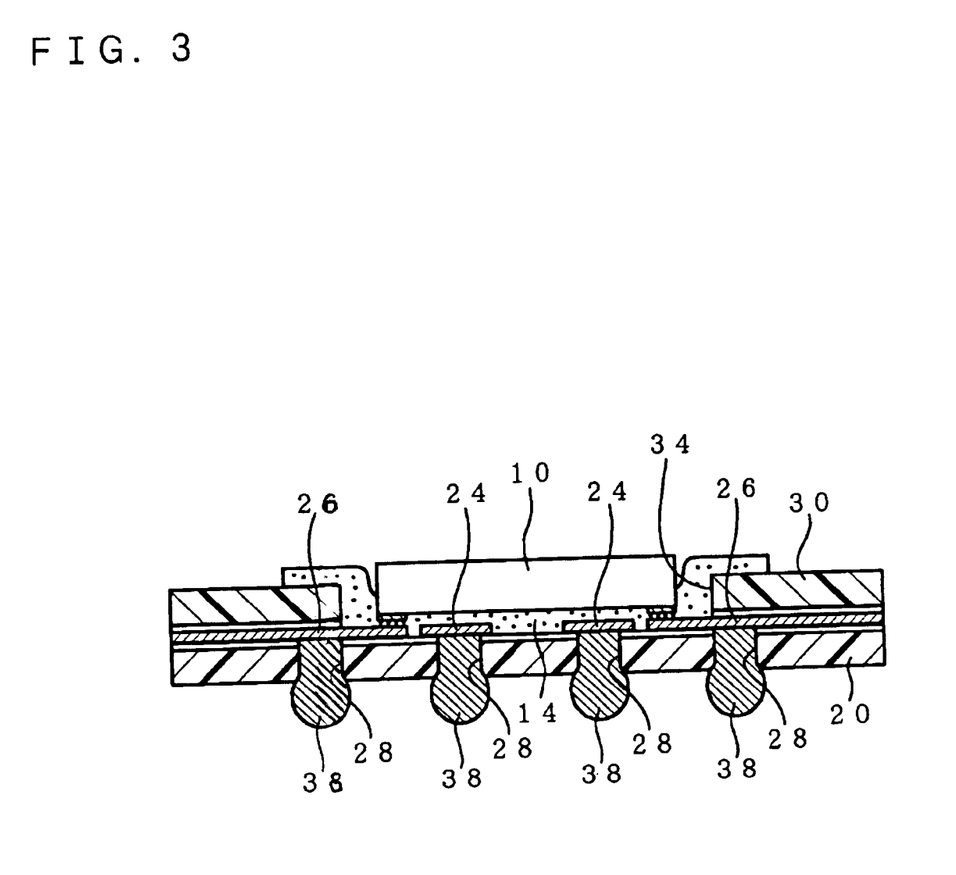
FIG. 3 shows another embodiment of a semiconductor device to which the present invention is applied.

FIG. 3 shows a semiconductor device manufactured by carrying out a step of adhering the second flexible substrate, and thereafter carrying out a step of mounting the semiconductor chip. In this figure, the construction of the semiconductor chip 10, the first flexible substrate 20, and the external terminals 38 is as described above. The second flexible substrate 30 also has, in itself, the same construction as described above, but the semiconductor device shown in FIG. 3 differs from the semiconductor device shown in FIG. 1 in that the conductive layer 32 and second insulating film 31 are not formed. As described above, in place of the first and second flexible substrates 20 and 30 in their final form, first and second flexible substrates 40 and 42 in tape form or larger than the final form may be used. The following description is based on FIG. 3.

In the method of manufacture, first, the second flexible substrate 30 is adhered to the first flexible substrate 20. In more detail, the region of mounting of the semiconductor chip 10 is avoided by means of the hole 34, and the second flexible substrate 30 is adhered to the first flexible substrate 20. In this case, the first flexible substrate 20 and the wiring pattern 22 are adhered by adhesive, and preferably the same adhesive is provided on the wiring pattern 22, and the second flexible substrate 30 is adhered. By means of this, a construction symmetrical in the thickness direction is obtained.

Next, on the surface of the first flexible substrate 20 on which the wiring pattern 22 is formed, the anisotropic conductive material 14 is provided. The anisotropic conductive material 14 may be provided so as to extend over the second flexible substrate 30. Then the semiconductor chip 10 is mounted on the first flexible substrate 20, and the electrodes 12 and the wiring pattern 22 are electrically connected. By the above process, the semiconductor device shown in FIG. 3 can be obtained.

The step of providing the external terminals 38 is commonly carried out after the step of mounting the semiconductor chip 10 on the first flexible substrate 40 (20) and the step of adhering the second flexible substrate 42 (30) to the first flexible substrate 40 (20). The step of providing the external terminals 38 may include steps in which solder balls are mounted, or solder paste is provided, and in a reflow step the solder is fused.

In the above embodiment, an example was described in which the semiconductor chip 10 is bonded using the anisotropic conductive material 14, but the present invention is not limited to this. The method of mounting may be any of face-up bonding, face-down bonding, or TAB bonding. In face-up bonding, the electrodes 12 of the semiconductor chip 10 and the wiring pattern 22 are connected by wire bonding, and thereafter the mounting portion of the semiconductor chip 10 is commonly covered with resin. In the case of face-down mounting, any of the methods of using an electrically conductive resin paste, of using metal bonding by Au—Au, Au—Sn, solder, or the like, or of using the contraction force of an insulating resin may be used.

In addition, the following modifications of the semiconductor device of the present invention are also possible.

(1) According to another aspect of the present invention, there is provided a semiconductor device in which a semiconductor chip is mounted on a surface of a first flexible substrate on which a wiring pattern is formed, and electrodes of the semiconductor chip and the wiring pattern are connected by wires.

This is a wire-bonding type of semiconductor device, and for example may be one type of CSP. The method of manufacture thereof includes a step in which the electrodes of the semiconductor chip and the wiring pattern are connected by wires.

(2) According to further aspect of the present invention, there is provided a semiconductor device in which a semiconductor chip and a first flexible substrate are positioned spaced apart, leads are provided on a first flexible substrate, the leads are connected to a wiring pattern and project from the edge of the first flexible substrate, and the leads are bent and connected to electrodes of the semiconductor chip.

This semiconductor device may also be a type of CSP. It should be noted that between the first flexible substrate and the semiconductor chip, a gap may be left, and filled with resin.

The method of manufacture thereof includes a step in which the electrodes of the semiconductor chip and the leads are connected. It should be noted that single point bonding may be applied for the connection of the leads.

(3) According to still further aspect of the present invention, there is provided a semiconductor device in which a device hole is formed in a first flexible substrate, a wiring pattern further includes inner leads which project (overhang) into the device hole from the first flexible substrate, and electrodes of a semiconductor chip and the inner leads are connected.

This semiconductor device may be a type of T-BGA (Tape-Ball Grid Array). The method of manufacture thereof includes a step of connecting the electrodes of the semiconductor chip and the inner leads. In this method of manufacture, TAB technology can be applied.

Figure 4:
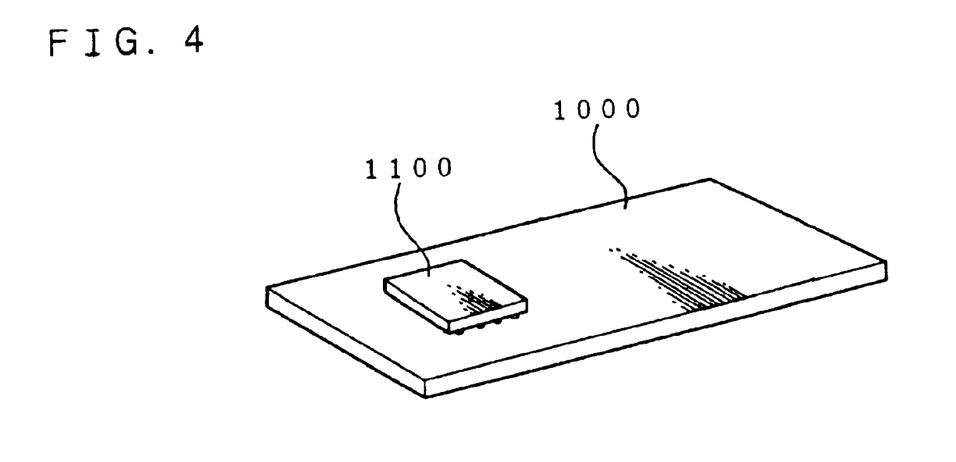
FIG. 4 shows an embodiment of a circuit board of the present invention.

FIG. 4 shows a circuit board 1000 on which is mounted the semiconductor device 1100 to which the present invention is applied. For the circuit board is generally used an organic substrate such as a glass epoxy substrate or the like. On the circuit board, a wiring pattern of for example copper is formed to constitute a desired circuit, then by mechanical connection of the wiring pattern and the external terminals of the semiconductor device, electrical connection is achieved.

Figure 5:
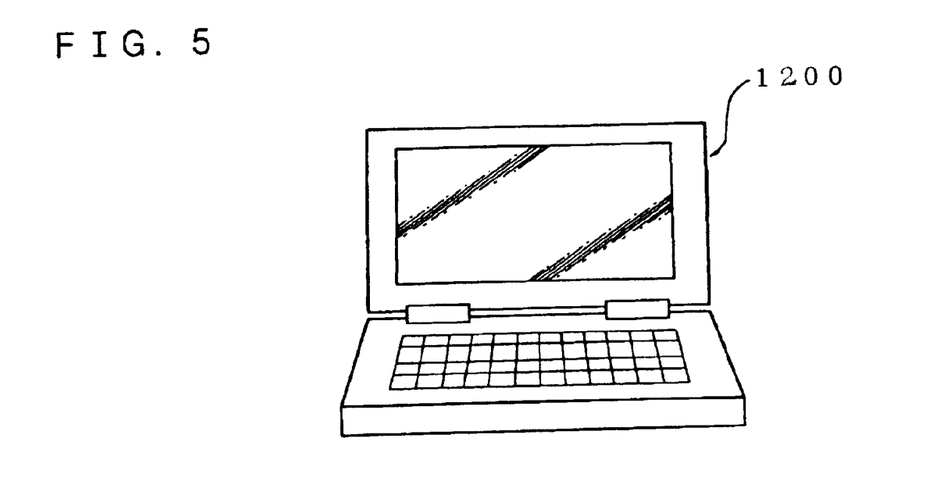
FIG. 5 shows an electronic instrument equipped with the semiconductor device of the present invention.

Then as an electronic instrument equipped with the semiconductor device to which the present invention is applied, or electronic instrument equipped with the above described circuit board, a notebook personal computer 1200 is shown in FIG. 5.

It should be noted that the above-described "semiconductor chip" as a structural element of the present invention may be replaced by an "electronic element" (whether an active element or a passive element to fabricate various electronic components in the same way as the semiconductor device. As electronic components manufactured using such an electronic element may be cited, for example, resistors, capacitors, coils, oscillators, filters, temperature sensors, thermistors, varistors, variable resistors, and fuses.

I claim:

1. A semiconductor device comprising:
    a semiconductor chip on which a plurality of electrodes are formed;
    a first flexible substrate in a tape form on which a wiring pattern is formed and on which the semiconductor chip is mounted;
    a plurality of external terminals electrically connected to the electrodes with the wiring pattern interposed; and
    a second flexible substrate in a tape form adhered to the first flexible substrate by a resin avoiding the semiconductor chip,
    wherein the second flexible substrate is formed of the same material as the first flexible substrate, and the first and second flexible substrates are of substantially the same thickness.

2. The semiconductor device as defined in claim 1,
    wherein the wiring pattern is disposed to face the second flexible substrate; and
    wherein a plurality of through holes are formed in the first flexible substrate;
    wherein the external terminals are provided to be connected with the wiring pattern via the through holes; and
    wherein the external terminals project from a surface of the first flexible substrate opposite to a surface on which the wiring pattern is formed.

3. The semiconductor device as defined in claim 2,
    wherein the electrodes of the semiconductor chip are electrically connected to the wiring pattern by electrically conductive particles dispersed in the resin.

4. The semiconductor device as defined in claim 2,
    wherein the resin is provided on a surface of the first flexible substrate on which the wiring pattern is formed, and is in close contact with a surface of the wiring pattern facing the second flexible substrate and edge surfaces of the wiring pattern.

5. A circuit board on which is mounted the semiconductor device as defined in claim 1.

6. An electronic instrument having the semiconductor device as defined in claim 1.

7. A semiconductor device comprising:
    a semiconductor chip on which a plurality of electrodes are formed;
    a first flexible substrate on which a wiring pattern is formed and on which the semiconductor chip is mounted;
    a plurality of external terminals electrically connected to the electrodes with the wiring pattern interposed;
    a second flexible substrate adhered to the first flexible substrate avoiding the semiconductor chip; and
    a conductive layer which is formed between the first and second flexible substrates, wherein the first and second flexible substrates are of the same material and of substantially the same thickness as the wiring pattern, and the conductive layer is electrically insulated from the wiring pattern.

8. The semiconductor device as defined in claim 7,
    wherein the means of adherence of the first flexible substrate and the wiring pattern, and the means of adherence of the second flexible substrate and the conductive later are the same.

9. The semiconductor device as defined in claim 7,
    wherein the conductive layer is of a symmetrical form with the wiring pattern.

10. The semiconductor device as defined in claim 7,
    wherein a first insulating film is formed on a surface of the wiring pattern opposite to the first flexible substrate; and
    wherein a second insulating film is formed on a surface of the conductive layer opposite to the second flexible substrate.

11. A circuit board on which is mounted the semiconductor device as defined in claim 7.

12. An electronic instrument having the semiconductor device as defined in claim 7.

13. A semiconductor device comprising:
    a semiconductor chip on which a plurality of electrodes are formed;
    a first flexible substrate in a tape form on which a wiring pattern is formed and on which the semiconductor chip is mounted;
    a plurality of external terminals electrically connected to the electrodes with the wiring pattern interposed; and
    a second flexible substrate in a tape form adhered to the first flexible substrate by a resin avoiding the semiconductor chip,
    wherein the second flexible substrate is formed of a material having a coefficient of thermal expansion substantially equal to a coefficient of thermal expansion of a material of the first flexible substrate, and the first and second flexible substrates are of substantially the same thickness.

14. A circuit board on which is mounted the semiconductor device as defined in claim 13.

15. An electronic instrument having the semiconductor device as defined in claim 13.

* * * * *